(12) United States Patent
Song (10) Patent No.: US 7,835,208 B2
(45) Date of Patent: *Nov. 16, 2010

(54) MULTI-LEVEL DYNAMIC MEMORY DEVICE

(75) Inventor: Ki-whan Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 12 days.

This patent is subject to a terminal disclaimer.

(21) Appl. No.: 12/364,119

(22) Filed: Feb. 2, 2009

(65) Prior Publication Data

US 2009/0207648 A1   Aug. 20, 2009

Related U.S. Application Data

(62) Division of application No. 11/638,002, filed on Dec. 13, 2006, now Pat. No. 7,505,302.

(30) Foreign Application Priority Data

Dec. 15, 2005   (KR) .................. 10-2005-0124005

(51) Int. Cl.
G11C 7/02 (2006.01)
G11C 5/08 (2006.01)
G11C 7/00 (2006.01)

(52) U.S. Cl. .................. 365/207; 365/69; 365/205; 365/206; 365/210.12; 365/210.13

(58) Field of Classification Search .................. 365/63, 365/69, 205, 206, 207, 210.1, 210.12, 210.13
See application file for complete search history.

(56) References Cited

U.S. PATENT DOCUMENTS

| | | | |
|---|---|---|---|
| 5,682,343 A | 10/1997 | Tomishima et al. | |
| 5,844,833 A | 12/1998 | Zargar et al. | |
| 5,973,983 A * | 10/1999 | Hidaka | 365/230.03 |
| 6,137,739 A | 10/2000 | Kim | |
| 6,768,663 B2 | 7/2004 | Ogata | |
| 2002/0163844 A1 | 11/2002 | Kurjanowicz | |
| 2003/0043656 A1 * | 3/2003 | Abedifard et al. | 365/200 |
| 2003/0169616 A1 | 9/2003 | Noro | |
| 2005/0232035 A1 | 10/2005 | Miyakawa et al. | |
| 2007/0139994 A1 | 6/2007 | Song et al. | |

FOREIGN PATENT DOCUMENTS

| | | |
|---|---|---|
| EP | 0044046 | 1/1982 |
| JP | 3-237683 | 10/1991 |
| JP | 11-73781 | 3/1999 |
| JP | 2001-273779 | 10/2001 |

* cited by examiner

*Primary Examiner*—Ly D Pham
(74) *Attorney, Agent, or Firm*—Mills & Onello, LLP (57) ABSTRACT

A multi-level dynamic memory device includes a bit line pair that is divided into a main bit line pair and a sub-bit line pair, first and second sense amplifiers that are connected between the main bit line pair and between the sub-bit line pair, first and second coupling capacitors that are cross-coupled between the main bit pair and the sub-bit pair, respectively; and first and second correction capacitors that are connected in parallel to the first and second coupling capacitors, respectively, and whose capacitance is adjusted by a control voltage signal.

8 Claims, 6 Drawing Sheets

FIG. 6

MULTI-LEVEL DYNAMIC MEMORY DEVICE

CROSS REFERENCE TO RELATED APPLICATION

This application is a divisional application of U.S. patent application Ser. No. 11/638,002, filed on Dec. 13, 2006, which claims the benefit of Korean patent application number 10-2005-0124005, filed on Dec. 15, 2005, in the Korean Intellectual Property Office, the contents of which applications are incorporated herein in their entirety by reference.

BACKGROUND OF THE INVENTION

1. Technical Field

The present invention relates to a multi-level dynamic memory device, and more particularly, to a multi-level dynamic memory having an increased sensing margin.

2. Description of the Related Art

In recent years, various methods of storing more information in a limited wafer area have been developed. For example, sophisticated lithography methods and sophisticated lithography devices have been developed and used to manufacture more memory cells in a limited wafer area. In another method, one or more bits are stored in one memory cell so as to raise the degree of integration per unit area of the dynamic memory device. It is known that this method can be implemented with a multi-level dynamic memory device.

A conventional multi-level dynamic memory device includes a bit line pair that is divided into a main bit line pair and a sub-bit line pair, first sense amplifiers that are connected between the main bit line pair, second sense amplifiers that are connected between the sub-bit line pair, and first and second coupling capacitors that are cross-coupled between the main bit line pair and the sub-bit line pair.

In such a multi-level dynamic memory device, a sensing margin is reduced due to the reasons described below. Hereinafter, a case will be exemplified in which memory cells to be read are connected to one of the main bit line pair.

Since the first and second coupling capacitors are cross-coupled between the main bit line pair and the sub-bit line pair, when the first sense amplifier develops a voltage between the main bit line pair, a voltage between the sub-bit line pair varies in an opposite direction. Accordingly, when capacitance of each of the first and second coupling capacitors is too small, a "10" sensing margin is reduced, and when it is too large, a "11" sensing margin is reduced.

When a restoring process is performed in the conventional multi-level dynamic memory device, the main bit line pair and the sub-bit line pair share a charge, and thus the restoring process is performed. Accordingly, when the charge is shared, as capacitance of the sub-bit line pair becomes half of total capacitance between the capacitance of the main bit line pair and the capacitance of the cell capacitor, a restored level becomes more accurate. However, since the capacitance of a cell capacitor in a memory cell was much smaller than that of a bit line in the 1990s, the capacitance of the cell capacitor in the memory cell was ignored, and the lengths of the main bit line pair and the sub-bit line pair were set in a 2:1 relationship. However, in recent years, with the development of cell capacitor manufacturing technologies, the capacitance of the cell capacitor has increased to become about one third of the capacitance of the bit line, and thus, the capacitance of the cell capacitor cannot be ignored. That is, the sensing margin is reduced due to the capacitance of the cell capacitor.

SUMMARY OF THE INVENTION

In accordance with one aspect, the present invention is directed to a multi-level dynamic memory device includes a bit line pair that is divided into a main bit line pair and a sub-bit line pair, first and second sense amplifiers that are connected between the main bit line pair and between the sub-bit line pair, first and second coupling capacitors that are cross-coupled between the main bit pair and the sub-bit pair, respectively, and first and second correction capacitors that are connected in parallel to the first and second coupling capacitors and whose capacitance is adjusted by a control voltage signal.

In one embodiment, the first correction capacitor is comprised of a MOS-type capacitor that has a gate connected to one node of the first coupling capacitor and a source and a drain connected to a control voltage signal line supplying the control voltage signal, and the second correction capacitor is comprised of a MOS-type capacitor that has a gate connected to one node of the second coupling capacitor and a source and a drain connected to the control voltage signal line supplying the control voltage signal.

In one embodiment, the multi-level dynamic memory device further includes a control voltage signal generating circuit that has fuses adjusting a voltage level of the control voltage signal by means of a trimming method.

In accordance with a second aspect, the present invention is directed to a multi-level dynamic memory device includes a bit line pair that is divided into a main bit line pair and a sub-bit line pair, first and second sense amplifiers that are connected between the main bit line pair and between the sub-bit line pair, respectively, and first and second coupling capacitors that are cross-coupled between the main bit line pair and the sub-bit line pair, respectively. Capacitances of the first and second coupling capacitors are adjusted by a control voltage signal.

In one embodiment, each of the first and second coupling capacitors is comprised of a MOS-type capacitor, and a control voltage signal line supplying the control voltage signal is connected to a substrate of the MOS-type capacitor.

In one embodiment, the multi-level dynamic memory device further includes a control voltage signal generating circuit that has fuses adjusting a voltage level of the control voltage signal by means of a trimming method.

In one embodiment, the multi-level dynamic memory device further includes: a plurality of memory cells, each of which is connected to one of a plurality of word lines and one of the bit line pair; and a plurality of dummy memory cells, each of which is connected to one of a plurality of dummy word lines and one of the bit line pair. When a restoring operation is performed in a predetermined memory cell, a dummy word line connected to a corresponding dummy memory cell is enabled.

In one embodiment, capacitance of the main bit line pair is twice the capacitance of the sub-bit line pair.

In one embodiment, the plurality of dummy memory cells comprises: first and second dummy memory cells, each of which is connected to one of the dummy word lines and one of the main bit line pair; and a third dummy memory cell that is connected to one of the dummy word lines and one of the sub-bit line pair.

In one embodiment, when a restoring operation is performed in the memory cell connected to one of the main bit line pair, the dummy word lines connected to the first and third dummy memory cells are enabled.

In one embodiment, when a restoring operation is performed in the memory cell connected to one of the sub-bit line pair, the dummy word lines connected to the first and second dummy memory cells are enabled.

In accordance with a third aspect, the present invention is directed to a multi-level dynamic memory device includes a plurality of word lines and a plurality of dummy word lines, a bit line pair that is divided into a main bit line pair and a sub-bit line pair, a plurality of memory cells, each of which is connected to one of the word lines and one of the bit line pair, first and second sense amplifiers that are connected between the main bit line pair and between the sub-bit line pair, respectively, first and second coupling capacitors that are cross-coupled between the main bit line pair and the sub-bit line pair, respectively, and a plurality of dummy memory cells, each of which is connected to one of the dummy word lines and one of the bit line pair, wherein, when a restoring operation is performed in the predetermined memory cell, a dummy word line connected to a corresponding dummy memory cell is enabled.

In one embodiment, capacitance of the main bit line pair is twice the capacitance of the sub-bit line pair.

In one embodiment, capacitance of a capacitor of the memory cell is the same as capacitance of a capacitor of the dummy memory cell.

In one embodiment, the plurality of dummy memory cells comprises: first and second dummy memory cells, each of which is connected to one of the dummy word lines and one of the main bit line pair; and a third dummy memory cell being connected to one of the dummy word lines and one of the sub-bit line pair.

In one embodiment, when a restoring operation is performed in a memory cell connected to one of the main bit line pair, the dummy word lines connected to the first and third dummy memory cells are enabled.

In one embodiment, when a restoring operation is performed in a memory cell connected to one of the sub-bit line pair, the dummy word lines connected to the first and second dummy memory cells are enabled.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE EXEMPLARY EMBODIMENT

Figure 1:
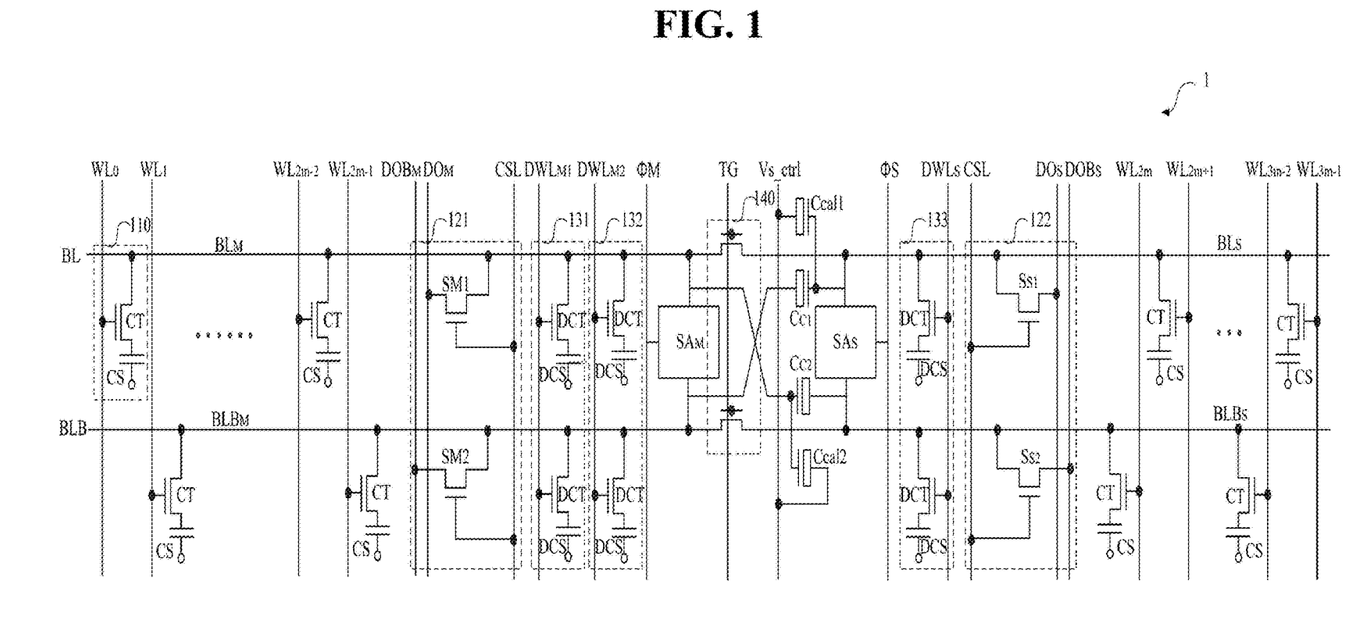
FIG. 1 is a circuit diagram illustrating a multi-level dynamic memory device according to an embodiment of the present invention.
Figure 2A:
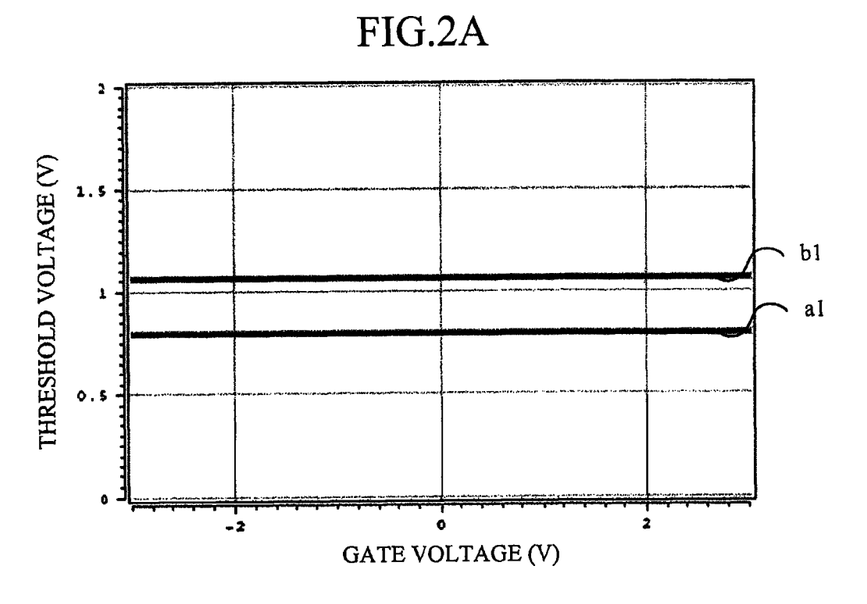
FIGS. 2A and 2B are diagrams illustrating variation of capacitance of first and second correction capacitors according to the variation of a first control voltage signal.
Figure 2B:
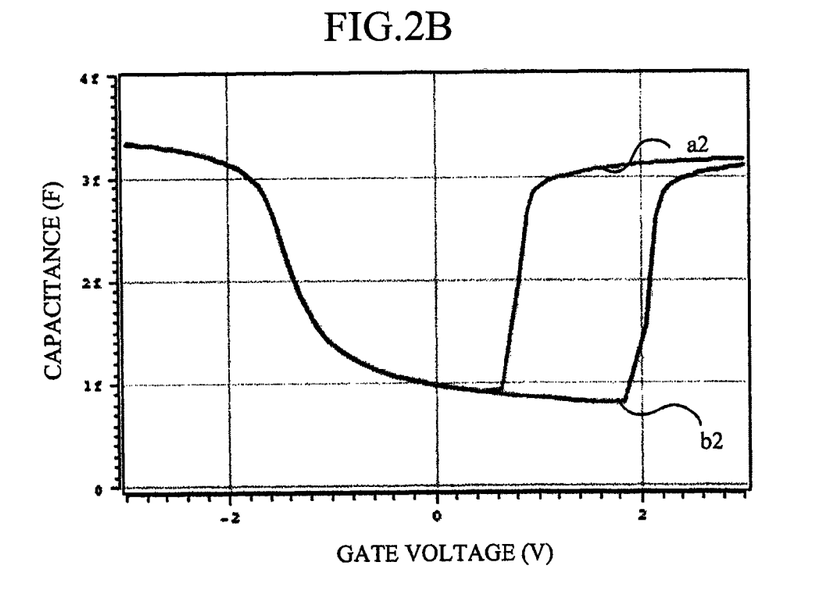

FIG. 1 is a circuit diagram illustrating a multi-level dynamic memory device according to an embodiment of the present invention, and FIGS. 2A and 2B are diagrams illustrating the reason why capacitances of first and second correction capacitors vary according to the variation of a first control voltage signal.

Referring to FIG. 1, in a multi-level dynamic memory device 1 according to the embodiment of the present invention, bits of each of memory cell 110 are provided to a bit line BL, then through first and second sense amplifiers $SA_M$ and $SA_S$, and outputted through pairs of data lines $DO_M$ and $DOB_M$, and $DO_S$ and $DOB_S$.

A pair of bit lines BL and BLB is divided into a pair of main bit lines $BL_M$ and $BLB_M$ and a pair of sub-bit lines $BL_S$ and $BLB_S$ on the basis of a transfer transistor 140 that is controlled by a transfer signal TG. Capacitance at the pair of main bit lines $BL_M$ and $BLB_M$ may be twice as much as capacitance at the pair of sub-bit lines $BL_S$ and $BLB_S$. In order to allow the capacitance at the pair of main bit lines $BL_M$ and $BLB_M$ to be twice as much as the capacitance at the pair of sub-bit lines $BL_S$ and $BLB_S$, for example, lengths of the pair of main bit lines $BL_M$ and $BLB_M$ may be twice the lengths of the pair of sub-bit lines $BL_S$ and $BLB_S$.

In this case, each of the memory cells 110 is connected to one of a plurality of word lines WLi (where i=0 to $3_{m-1}$) and one of the pair of bit lines BL and BLB. However, since the lengths of the pair of main bit lines $BL_M$ and $BLB_M$ are different from the lengths of the pair of sub-bit lines $BL_S$ and $BLB_S$, if the number of memory cells 110 that are connected to one $BL_M$ or $BLB_M$ of the pair of main bit lines $BL_M$ an $BLB_M$ is 2m, the number of memory cells 110 that are connected to one $BL_S$ or $BLB_S$ of the pair of sub-bit lines $BL_S$ and $BLB_S$ is m.

The first sense amplifier $SA_M$ is connected between the pair of main bit lines $BL_M$ and $BLB_M$, and develops a voltage difference between the pair of main bit lines $BL_M$ and $BLB_M$ in response to a first sense amplifier enable signal $\Phi_M$. The second sense amplifier $SA_S$ is connected between the pair of sub-bit lines $BL_S$ and $BLB_S$, and develops a voltage difference between the pair of sub-bit lines $BL_S$ and $BLB_S$ in response to a second sense amplifier enable signal $\Phi_S$. Although not shown in the drawings, the first and second sense amplifiers $SA_M$ and $SA_S$ may include a P-type sense amplifier and an N-type sense amplifier.

A first switching unit 121 includes switching transistors $S_{M1}$ and $S_{M2}$ that are respectively formed between the main bit line pair $BL_M$ and $BLB_M$ and the data line pair $DO_M$ and $DOB_M$, and electrically connects the main bit line pair $BL_M$ and $BLB_M$ and the data line pair $DO_M$ and $DOB_M$ in response to a column selecting line signal CSL. A second switching unit 122 includes switching transistors $S_{S1}$ and $S_{S2}$ that are respectively formed between the sub-bit line pair $BL_S$ and $BLB_S$ and the dada line pair $DO_S$ and $DOB_S$ and electrically connects the sub-bit line pair $BL_S$ and $BLB_S$ and the data line pair $DO_S$ and $DOB_S$ in response to the column selecting line signal CSL.

The first and second coupling capacitors $C_{C1}$ and $C_{C2}$ are respectively cross-coupled between the main bit line pair $BL_M$ and $BLB_M$ and the sub-bit line pair $BL_S$ and $BLB_S$. Specifically, the first coupling capacitor $C_{C1}$ is connected between the complementary main bit line $BLB_M$ of the main bit line pair $BL_M$ and $BLB_M$ and the sub-bit line $BLB_S$ of the sub-bit line pair $BL_S$ and $BLB_S$, and the second coupling capacitor $C_{C2}$ is connected between the main bit line $BL_M$ of the main bit line pair $BL_M$ and $BLB_M$ and the complementary sub-bit line $BLB_S$ of the sub-bit line pair $BL_S$ and $BLB_S$. In the first and second coupling capacitors $C_{C1}$ and $C_{C2}$, when the first sense amplifier $SA_M$ develops a voltage between the main bit line pair $BL_M$ and $BLB_M$, a voltage between the sub-bit line pair $BL_S$ and $BLB_S$ varies in an opposite direction. As such, the varied voltage between the sub-bit line pair $BL_S$ and $BLB_S$ generates an offset voltage of the second sense amplifier $SA_S$.

The multi-level dynamic memory device 1 according to an exemplary embodiment of the present invention includes first and second correction capacitors Ccal1 and Ccal2 that are respectively connected in parallel to the first and second coupling capacitors $C_{C1}$ and $C_{C2}$ and whose capacitance is adjusted by a first control voltage signal Vs_ctrl. Specifically, the first correction capacitor Ccal1 may be a MOS-type capacitor that has a gate connected to one node of the first coupling capacitor $C_{C1}$ and a source and a drain connected to the first control voltage signal line supplying a first control voltage signal Vs_ctrl, and the second correction capacitor Ccal2 may be a MOS-type capacitor that has a gate connected to one node of the second coupling capacitor $C_{C2}$ and a source and a drain connected to the first control voltage signal line supplying the first control voltage signal Vs_ctrl.

Hereinafter, when each of the first and second correction capacitors Ccal1 and Ccal2 is the above-mentioned MOS-type transistor, the reason why the capacitance varies according the variation in the first control voltage signal Vs_ctrl will be described.

In FIG. 2A, an x axis indicates a gate voltage, and a y axis indicates a threshold voltage. Referring to FIG. 2A, it can be understood that the threshold voltage is about 0.7 V when the first control voltage signal Vs_ctrl is 0V (refers to reference numeral a1), and the threshold voltage is about 1.05 V when the first control voltage signal Vs_ctrl is 1 V (refers to reference numeral b1).

In FIG. 2B, an x axis indicates a gate voltage, and a y axis indicates capacitance. In a MOSFET, since a MOSFET enters an accumulation state, a depletion state, and an inversion state according to the variation in gate voltage, capacitance varies in the order of plus, minus, and plus. Specifically, in accordance with the signal amplitude of the first control voltage signal Vs_ctrl that is connected to the source and the drain of the MOSFET, a gate voltage that varies from the depletion to the inversion becomes different. Specifically, when the voltage level of the first control voltage signal Vs_ctrl is 0 V (refers to reference numeral a2), the gate voltage varies from the depletion to the inversion at a voltage of about 0.7 V, and when the voltage level of the first control voltage signal Vs_ctrl is 1 V (refers to reference numeral b2), the gate voltage varies from the depletion to the inversion at a voltage of about 2.05 V obtained by adding the threshold voltage 1.05 V to a source voltage 1 V. As a result, it can be understood that effective capacitance of a MOS-type capacitor varies with the first control voltage signal Vs_ctrl varied.

A voltage level of the first control voltage signal Vs_ctrl that is supplied to the first and second correction capacitors Ccal1 and Ccal2 may be adjusted by various methods. For example, the voltage level of the first control voltage signal Vs_ctrl may be adjusted from a wafer level or a package level by means of a fuse trimming method. Further, the voltage level of the first control voltage signal Vs_ctrl may be adjusted by using a mode register set (MRS) signal at the time of setting the multi-level dynamic memory device or a pre-determined control signal varied according to the variation in external temperature during the operation of the multi-level dynamic memory device. A case in which the voltage level of the first control voltage signal Vs_ctrl is adjusted by the fuse trimming method will be described in detail below with reference to FIG. 5.

Referring back to FIG. 1, the multi-level dynamic memory device 1 according to the embodiment of the present invention includes a plurality of dummy memory cells 131, 132, and 133 so as to minimize an error occurring when the restoring operation is performed. Each of the dummy memory cells 131, 132, and 133 is connected to one of the dummy word lines $DWL_{M1}$, $DWL_{M2}$, and $DWL_S$ and one of the bit line pair BL and BLB. Specifically, in FIG. 1, the multi-level memory device 1 includes the first and second dummy memory cells 131 and 132 each of which is connected to one of the dummy word lines $DWL_{M1}$ and $DWL_{M2}$ and one of the main bit line pair $BL_M$ and $BLB_M$, and the third dummy memory cell 133 that is connected to the dummy word line $DWL_S$ and one of the sub-bit line pair $BL_S$ and $BLB_S$.

When the restoring operation is performed in the predetermined memory cells, the dummy word lines $DWL_{M1}$, $DWL_{M2}$, and $DWL_S$ that are connected to the corresponding dummy memory cells 131, 132, and 133 are enabled. Specifically, at the time of the restoring operation of the memory cell 110 that is connected to one of the main bit line pair $BL_M$ and $BLB_M$, the dummy word lines $DWL_{M1}$, and $DWL_S$ that are connected to the first and third dummy memory cells 131 and 133 are enabled, and at the time of the restoring operation of the memory cell 110 that is connected to one of the sub-bit line pair $BL_S$ and $BLB_S$, the dummy word lines $DWL_{M1}$ and $DWL_{M2}$ that are connected to the first and second dummy memory cells 131 and 132 are enabled. The above is summarized in Table 1.

TABLE 1

|  |  | $DWL_{M1}$ | $DWL_{M2}$ | $DWL_S$ |
| --- | --- | --- | --- | --- |
| During Read Operation | | Disable | Disable | Disable |
| During Restoring Operation | When the memory cell on the side of the main bit line pair is selected | Enable | Disable | Enable |
| | When the memory cell on the side of the sub-bit line pair is selected | Enable | Enable | Disable |

The dummy memory cells 131, 132, and 133 will be described in detail below with reference to FIGS. 3 and 4.

Hereinafter, the operation of the multi-level dynamic memory device according to the embodiment of the present invention will be described with reference to FIGS. 1, 3, and 4.

Figure 3:
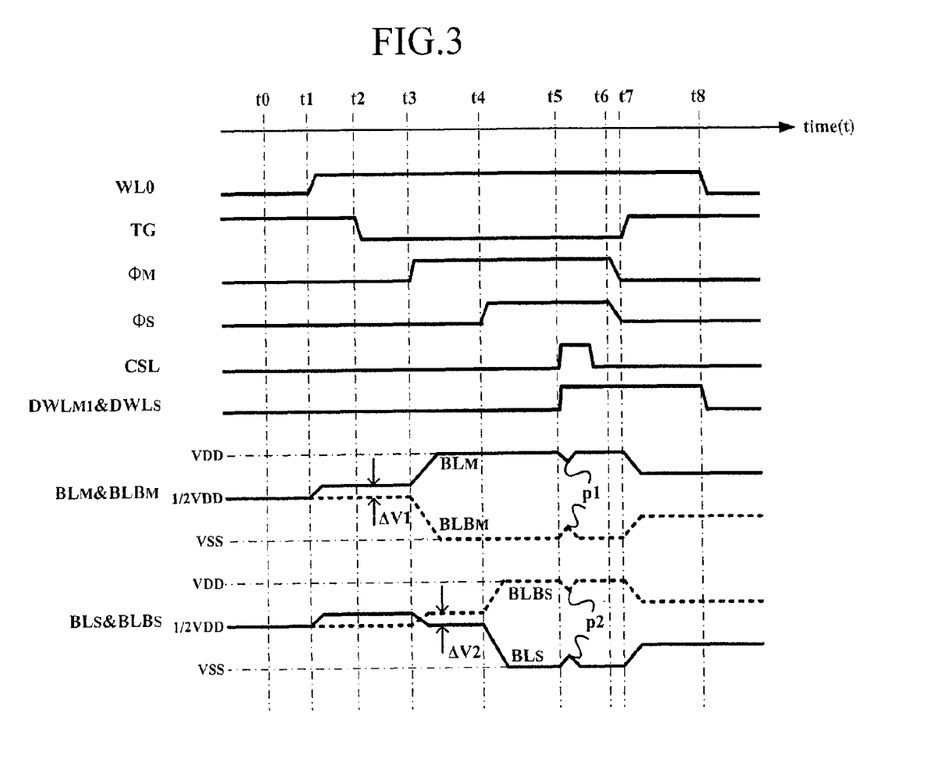
FIGS. 3 and 4 are timing charts illustrating the operation of a multi-level dynamic memory device according to an embodiment of the present invention.

FIG. 3 is a timing chart illustrating the operation of the multi-level dynamic memory device according to the embodiment of the present invention. The case in which the memory cell 110 to be read is connected to the word line WL0 and the main bit line $BL_M$ and data of two bits (1, 0) is stored in the corresponding memory cell 110 will be exemplified.

Since a voltage level of the transfer signal TG is a high level at the time t0, the main bit line pair $BL_M$ and $BLB_M$ is connected to the sub-bit line pair $BL_S$ and $BLB_S$. At this time, the main bit line pair $BL_M$ and $BLB_M$ and the sub-bit line pair $BL_S$ and $BLB_S$ are precharged with a voltage of ½ VDD.

Since the word line WL0 becomes a high level at the time t1, a charge that is stored in the cell capacitor of the memory cell 110 is supplied to the bit line pair BL and BLB, and the voltage between the pair of main bit lines $BL_M$ and $BLB_M$ and the voltage between the pair of sub-bit lines $BL_S$ and $BLB_S$ are respectively increased by $\Delta V1$.

Since the transfer signal TG becomes a low level at the time t2, the main bit line pair $BL_M$ and $BLB_M$ and the sub-bit line pair $BL_S$ and $BLB_S$ are electrically isolated from each other.

Since the first sense amplifier enable signal $\Phi_M$ becomes a high level at the time t3, the voltage difference between the main bit line pair $BL_M$ and $BLB_M$ is developed. When the voltage difference between the main bit line pair $BL_M$ and $BLB_M$ is developed, the voltage difference between the sub-bit line pair $BL_S$ and $BLB_S$ varies in an opposite direction. That is, when the voltage of the sub-bit line $BL_S$ is decreased by $\Delta V2$, the voltage of the complementary sub-bit line $BLB_S$ is increased by $\Delta V2$.

As such, the variation of the voltage between the sub-bit line pair $BL_S$ and $BLB_S$ in an opposite direction depends on the capacitance of the first and second coupling capacitors $C_{C1}$ and $C_{C2}$, and the capacitance of the first and second capacitors $C_{C1}$ and $C_{C2}$ may not be constant due to the variation in manufacture process. However, since the multi-level dynamic memory device 1 according to the embodiment of the present invention includes the first and second correction capacitors Ccal1 and Ccal2, even though the capacitance of the first and second coupling capacitors $C_{C1}$ and $C_{C2}$ may be not constant, $\Delta V2$ by which the voltage between the sub-bit line pair $BL_S$ and $BLB_S$ varies in an opposite direction can be adjusted to a predetermined value.

Specifically, if the first control voltage signal Vs_ctrl of the low voltage level is supplied, the effective capacitance of the first and second correction capacitors Ccal1 and Ccal2 are increased, a large amount of charge is consumed from a charge to be supplied from the main bit line pair $BL_M$ and $BLB_M$ to the sub-bit line pair $BL_S$ and $BLB_S$ through the first and second coupling capacitors $C_{C1}$ and $C_{C2}$, which results in decreasing the variation $\Delta V2$ by which the voltage between the sub-bit line pair $BL_S$ and $BLB_S$ varies in an opposite direction.

In addition, if the first control voltage signal Vs_ctrl of the high voltage level is supplied, the effective capacitance of the first and second correction capacitors Ccal1 and Ccal2 are decreased, a small amount of charge is consumed from a charge to be supplied from the main bit line pair $BL_M$ and $BLB_M$ to the sub-bit line pair $BL_S$ and $BLB_S$ through the first and second coupling capacitors $C_{C1}$ and $C_{C2}$, which results in increasing the variation $\Delta V2$ by which the voltage between the sub-bit line pair $BL_S$ and $BLB_S$ varies in an opposite direction.

Since the second sense amplifier enable signal $\Phi_S$ becomes a high level at the time t4, the voltage difference between the sub-bit line pair $BL_S$ and $BLB_S$ is developed.

If the voltage difference between the sub-bit line pair $BL_S$ and $BLB_S$ is sufficiently developed at the time t5, the column selection signal CSL becomes a high level, and the dummy word lines $DWL_{M1}$ and $DWL_S$ that are connected to the first and third dummy memory cells 131 and 133 become a high level. In the multi-level dynamic memory device according to the embodiment of the present invention, the column selection signal CSL and the dummy word lines $DWL_{M1}$ and $DWL_S$ are enabled to become a high level at the same time, but the present invention is not limited thereto. That is, the column selection signal CSL may first become a high level or the dummy word lines $DWL_{M1}$ and $DWL_S$ may first become a high level.

First, since the column selection signal CSL becomes a high level, the first switching unit 121 is enabled, and thus the main bit line pair $BL_M$ and $BLB_M$ and the data line pair $DO_M$ and $DOB_M$ are electrically connected to each other. In addition, the second switching unit 122 is enabled, and thus the sub-bit line pair $BL_S$ and $BLB_S$ and the data line pair $DO_S$ and $DOB_S$ are electrically connected to each other. Therefore, bits transmitted through the data line pairs $DO_M$ and $DOB_M$ and $DO_S$ and $DOB_S$ are read as (1, 0).

Since the dummy word lines $DWL_{M1}$ and $DWL_S$ that are connected to the first and third dummy memory cells 131 and 133 become a high level, the charge is charged in the cell capacitor of each of the dummy memory cells 131 and 133. At this time, as shown in FIG. 3, the main bit line pair $BL_M$ and $BLB_M$ and the sub-bit line pair $BL_S$ and $BLB_S$ have constant peaks p1 and p2, respectively.

When the first and second sense amplifier signals $\Phi_M$ and $\Phi_S$ become a low level at the time t6, the first and second sense amplifiers $SA_M$ and $SA_S$ are disabled.

If the transfer signal TG becomes a high level at the time t7, the main bit line pair $BL_M$ and $BLB_M$ is connected to the sub-bit line pair $BL_S$ and $BLB_S$. Accordingly, the main bit line pair $BL_M$ and $BLB_M$ and the sub-bit line pair $BL_S$ and $BLB_S$ share a charge, and a restoring operation for restoring bits in the cell capacitor CS of the memory cell 110 is performed.

In this case, the multi-level dynamic memory device 1 according to the embodiment of the present invention includes the dummy memory cells 131, 132, and 133, which allows a level restored in the capacitance of the cell capacitor CS of the memory cell 110 to become accurate. That is, even if the ratio of the capacitance of the cell capacitor CS to the capacitance of the bit line BL cannot be ignored, the restoring process can be performed with an accurate level.

Specifically, the voltage level, which is restored in the memory cell 110 connected to the main bit line $BL_M$, can be represented by Equation 1. In this case, Vrst1 indicates a restored level, $C_{total}$ is a total capacitance, $Q_{total}$ is a total charge amount, $C_{BLM}$ is a capacitance of the main bit line $BL_M$, $C_{BLS}$ is capacitance of the sub-bit line $BL_S$, CS indicates capacitance of the cell capacitor CS, and DCS indicates capacitance of the dummy cell capacitor DCS. As the capacitance of the main bit line $BL_M$ is twice as much as the capacitance of the sub-bit line $BL_S$, the relation $C_{BLM}=2C_{BLS}$ is formed, and the capacitance of the dummy cell capacitor DCS is the same as the capacitance of the cell capacitor CS, the relationship CS=DCS is formed. As in Equation 1, the restored voltage level becomes accurately ⅔ VDD without being affected by the capacitance of the cell capacitor CS, due to the capacitance of the dummy cell capacitor DCS.

$$Vrst1 = \frac{Q_{total}}{C_{total}} \quad \text{Equation 1}$$
$$= \frac{(C_{BLM} + CS + DCS) \times VDD}{(C_{BLM} + CS + DCS) + (C_{BLS} + DCS)}$$
$$= \frac{(2C_{BLS} + 2CS) \times VDD}{3C_{BLS} + 3CS}$$
$$= \frac{2}{3} VDD$$

At the time t8, the word line WL0 becomes a low level, and the dummy word lines $DWL_{M1}$ and $DWL_S$ become a low level. In this case, the dummy word lines $DWL_{M1}$ and $DWL_S$ become a low level prior to the word line WL0.

Figure 4:
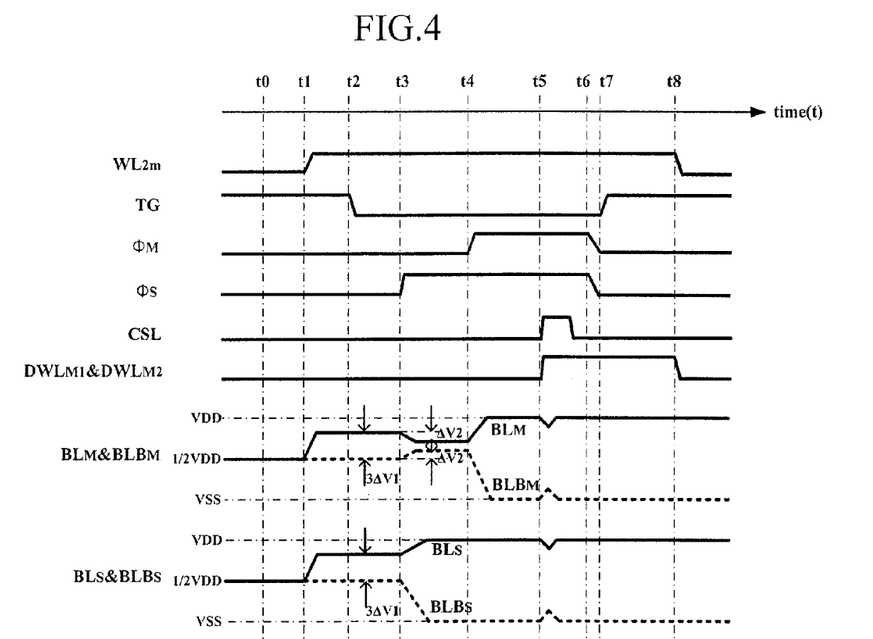

FIG. 4 is a timing chart illustrating the multi-level dynamic memory device according to the embodiment of the present invention. The case in which the memory cell 110 to be read is connected to the word line $WL_{2m}$ and the sub-bit line $BL_S$ and data (1, 1) of two bits is stored in the corresponding memory cell 110 will be exemplified.

Since the word line $WL_{2m}$ becomes a high level at the time t1, a charge that is stored in the cell capacitor of the memory cell 110 is supplied to the bit line pair BL and BLB, and the voltage between the pair of main bit lines $BL_M$ and $BLB_M$ and the voltage between the pair of sub-bit lines $BL_S$ and $BLB_S$ are respectively increased by $3\Delta V1$. In this case, $3\Delta V1$ is not limitative, but illustrative in all aspects.

Since the second sense amplifier enable signal $\Phi_S$ becomes a high level at the time t3, the voltage difference between the sub-bit line pair $BL_S$ and $BLB_S$ is developed. In the meantime, when the voltage difference between the sub-bit line pair $BL_S$ and $BLB_S$ is developed, the voltage between the main bit line pair $BL_M$ and $BLB_M$ varies in an opposite direction. That is, when the voltage of the main bit line $BL_M$ is decreased by $\Delta V2$, the voltage of the complementary main bit line $BLB_M$ is increased by $\Delta V2$.

If the transfer signal TG becomes a high level at the time t7, the main bit line pair $BL_M$ and $BLB_M$ is connected to the sub-bit line pair $BL_S$ and $BLB_S$. In this case, the voltage level Vrst2 that is restored in the memory cell 110 connected to the sub-bit line $BL_S$ can be represented by Equation 2. As in Equation 2, the restored voltage level may become accurately VDD without being affected by the capacitance of the cell capacitor 110, due to the capacitances of the dummy cell capacitors 131 and 132.

$$Vrst2 = \frac{Q_{total}}{C_{total}^{20}}$$
$$= \frac{(C_{BLM} + 2DCS) \times VDD + (C_{BLS} + CS) \times VDD}{(C_{BLM} + 2DCS) + (C_{BLS} + CS)}$$
$$= \frac{(3C_{BLS} + 3CS) \times VDD}{3C_{BLS} + 3CS}$$
$$= VDD$$

Equation 2

In FIGS. 3 and 4, only a case in which data of two bits (1, 0) and (1, 1) stored in the memory cell 110 is read has been described, but data of two bits (0, 0) and (0, 1) can also be read by the same method.

Figure 5:
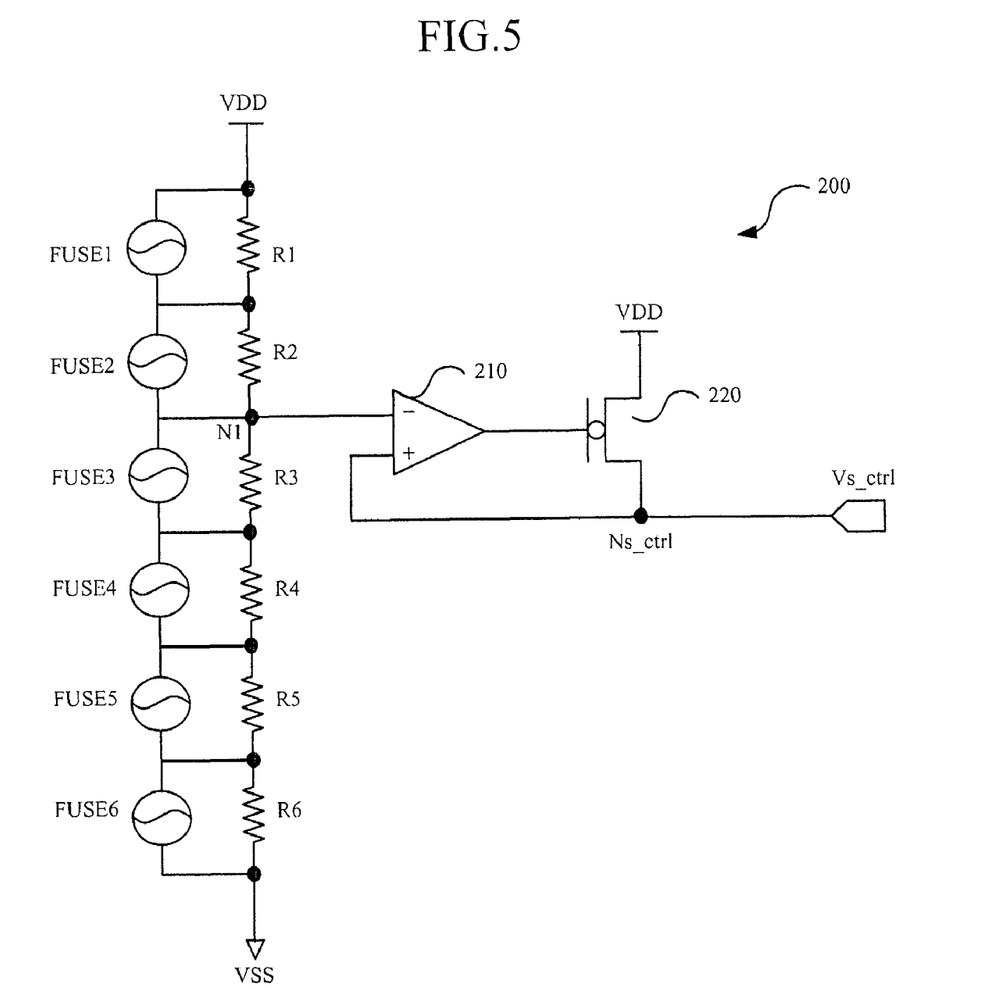
FIG. 5 is a circuit diagram illustrating a first control voltage signal generating circuit of a multi-level dynamic memory device according to an embodiment of the present invention.

FIG. 5 is a circuit diagram of the first control voltage signal generating circuit of the multi-level dynamic memory device according to the embodiment of the present invention.

Referring to FIG. 5, the first control voltage signal generating circuit 200 includes a string of resistors Rj (where j=1 to 6) that distribute voltages between the first voltage VDD and the second voltage VSS, a plurality of fuses fusej (where j=1 to 6) that connect respective nodes of the string of resistors Rj (where j=1 to 6), a differential amplifier 210 that subjects the voltage at the node N1 of the string of resistors Rj (where j=1 to 6) and the voltage at the first control voltage signal output node Ns_ctrl to the differential amplification, and a current driving transistor 220 that supplies a current to the first control voltage signal output node Ns_ctrl in accordance with the output signal of the differential amplifier 210.

In this case, when the outputted voltage level of the first control voltage signal Vs_ctrl does not a desired voltage level, the outputted voltage level of the first control voltage signal Vs_ctrl is confirmed while cutting at least a portion of the plurality of fuses fusej (where j=1 to 6) for trimming the voltage level. Examples of a method of cutting the fuses fusej (where j=1 to 6) may include a method using laser beams, a current blowing method, an electronic beam irradiating method, or the like, which do not limit the method of cutting the fuses.

Figure 6:
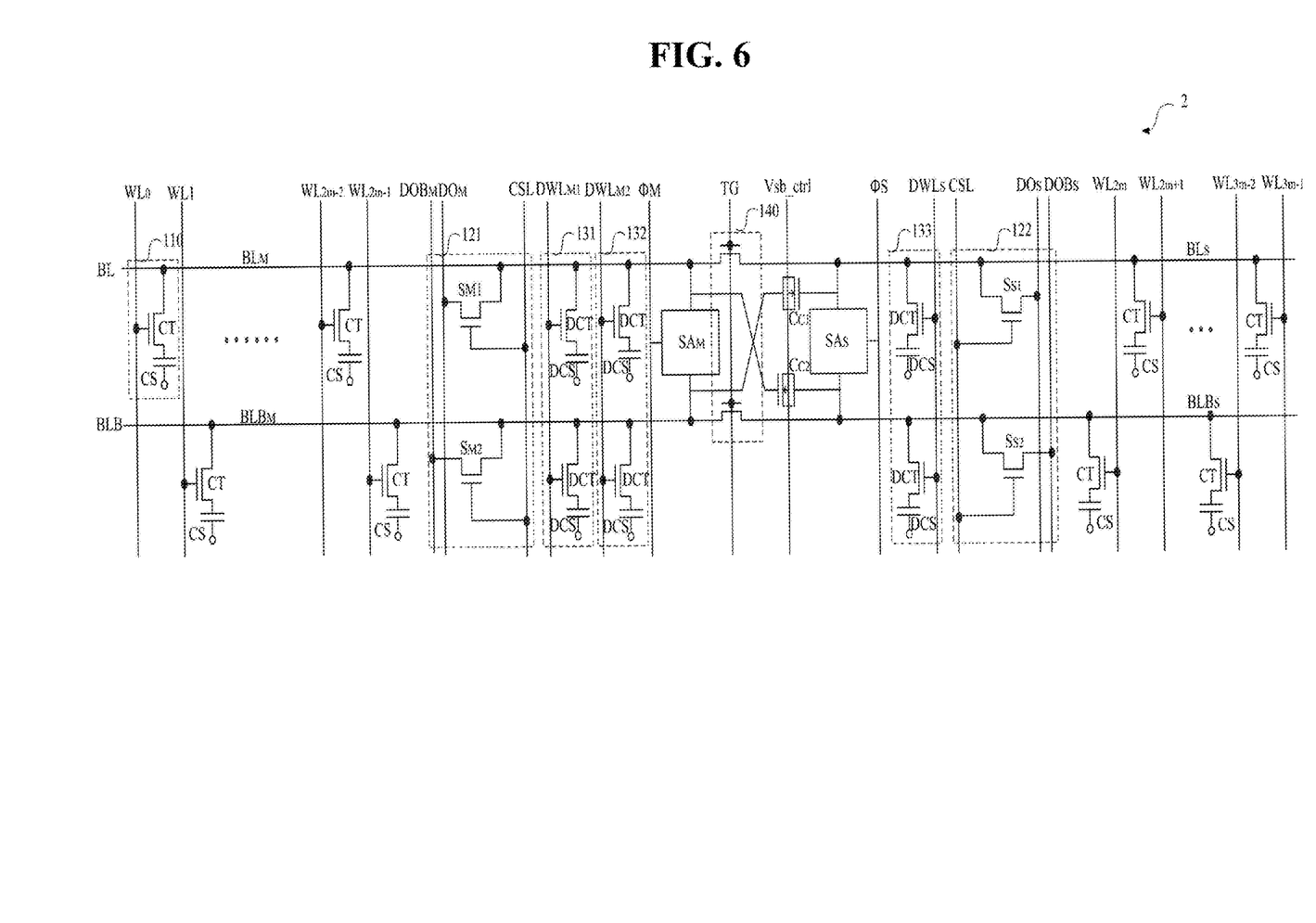
FIG. 6 is a circuit diagram illustrating a multi-level dynamic memory device according to another embodiment of the present invention.

FIG. 6 is a circuit diagram illustrating a multi-level dynamic memory device according to another exemplary embodiment of the present invention. In FIG. 6, the same constituent elements as those in FIG. 1 are denoted by the same reference numerals, and the detailed description thereof will not be repeated.

Referring to FIG. 6, the multi-level dynamic memory device 2 according to another embodiment of the present invention does not include the first and second correction capacitors (refers to Ccal1 and Ccal2 in FIG. 1), and the capacitance of the first and second coupling capacitors $C_{C1}$ and $C_{C2}$ are adjusted by the second control voltage signal Vsb_ctrl.

Specifically, each of the first and second coupling capacitors $C_{C1}$ and $C_{C2}$ is a MOS-type capacitor, and the second control voltage signal line supplying the second control voltage Vsb_ctrl is connected to a substrate of the MOS-type capacitor. Referring to Equation 3, the threshold voltage Vt of the MOSFET can be effectively varied by the substrate voltage Vsb connected to the substrate. In this case, Vt0 indicates a threshold voltage when the substrate voltage Vsb is 0 V, $\psi_f$ indicates a physical parameter ($2\psi_f$ is generally 0.6 V), and $\gamma$ indicates a process parameter.

$$Vt = Vt0 + \gamma[\sqrt{2\Psi_f + Vsb} - \sqrt{2\Psi_f}]$$

Equation 3

As a method of adjusting the voltage level of the second control voltage signal Vsb_ctrl, various methods may be used. For example, a fuse trimming method, a method using a mode register set signal, and a method using a predetermined control signal may be used.

The multi-level dynamic memory device according to the present invention can achieve the following effects.

Even though the capacitance of the first and second coupling capacitors that are cross-coupled between the main bit line pair and the sub-bit line pair vary according to the processes, it is possible to constantly maintain an amount of charge flowing between the main bit line pair and the sub-bit line pair through the first and second correction capacitors. Further, a restoring error, which may occur when the ratio of the capacitance of the cell capacitor to the capacitance of the bit line capacitor increases, can be reduced by the dummy memory cells. Accordingly, it is possible to increase the sensing margin of the multi-level dynamic memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-level dynamic memory device comprising:
    a bit line pair that is divided into a main bit line pair and a sub-bit line pair;
    first and second sense amplifiers that are connected between the main bit line pair and between the sub-bit line pair, respectively; and
    first and second coupling capacitors that are cross-coupled between the main bit line pair and the sub-bit line pair, respectively,
    wherein capacitance of the first and second coupling capacitors are adjusted by a control voltage signal.

2. The multi-level dynamic memory device of claim 1, further comprising:
    a plurality of memory cells, each of which is connected to one of a plurality of word lines and one of the bit line pair; and
    a plurality of dummy memory cells, each of which is connected to one of a plurality of dummy word lines and one of the bit line pair, wherein when a restoring operation is performed in a predetermined memory cell, a dummy word line connected to a corresponding dummy memory cell is enabled.

3. The multi-level dynamic memory device of claim 2, wherein capacitance of the main bit line pair is twice the capacitance of the sub-bit line pair.

4. The multi-level dynamic memory device of claim 2, the plurality of dummy memory cells comprising:
   first and second dummy memory cells, each of which is connected to one of the dummy word lines and one of the main bit line pair; and
   a third dummy memory cell that is connected to one of the dummy word lines and one of the sub-bit line pair.

5. The multi-level dynamic memory device of claim 4, wherein, when a restoring operation is performed in the memory cell connected to one of the main bit line pair, the dummy word lines connected to the first and third dummy memory cells are enabled.

6. The multi-level dynamic memory device of claim 4, wherein, when a restoring operation is performed in the memory cell connected to one of the sub-bit line pair, the dummy word lines connected to the first and second dummy memory cells are enabled.

7. The multi-level dynamic memory device of claim 1, wherein each of the first and second coupling capacitors is comprised of a MOS-type capacitor, and a control voltage signal line supplying the control voltage signal is connected to a substrate of the MOS-type capacitor.

8. The multi-level dynamic memory device of claim 7, further comprising a control voltage signal generating circuit that has fuses adjusting a voltage level of the control voltage signal by means of a trimming method.

* * * * *